United States Patent [19]

Gentle et al.

[11] Patent Number: 5,399,651
[45] Date of Patent: Mar. 21, 1995

[54] ADHESION PROMOTING ADDITIVES AND LOW TEMPERATURE CURING ORGANOSILOXANE COMPOSITIONS CONTAINING SAME

[75] Inventors: Theresa E. Gentle; Michael A. Lutz, both of Midland, Mich.

[73] Assignee: Dow Corning Corporation, Midland, Mich.

[21] Appl. No.: 240,409

[22] Filed: May 10, 1994

[51] Int. Cl.$^6$ ............................................. C08G 77/06
[52] U.S. Cl. ............................... 528/15; 528/18; 528/31; 528/32; 528/33; 556/431; 556/440; 556/443; 556/444
[58] Field of Search ............... 528/15, 18, 31, 32, 528/33; 556/431, 440, 443, 444

[56] References Cited

U.S. PATENT DOCUMENTS

| | | | |
|---|---|---|---|
| 4,082,726 | 4/1978 | Mine et al. | 260/46.5 UA |
| 4,087,585 | 5/1978 | Schulz | 428/429 |
| 4,196,273 | 4/1980 | Imai et al. | 528/15 |
| 4,659,851 | 4/1987 | Plueddemann | 556/431 |
| 4,719,262 | 1/1988 | Plueddemann | 525/105 |
| 4,721,764 | 1/1988 | Fujiki et al. | 528/15 |
| 4,732,932 | 3/1988 | Waldern | 524/862 |
| 4,786,701 | 11/1988 | Tanaka | 528/15 |
| 4,906,686 | 3/1990 | Suzuki et al. | 524/730 |
| 4,912,188 | 3/1990 | Colas et al. | 528/15 |

FOREIGN PATENT DOCUMENTS

| | | | |
|---|---|---|---|
| 0449181 | 10/1991 | European Pat. Off. | C08L 83/07 |
| 0458355 | 11/1991 | European Pat. Off. | C08G 77/50 |
| 0469890 | 2/1992 | European Pat. Off. | C08L 83/07 |

OTHER PUBLICATIONS

Japanese Abstract 4311766, Nov. 1992.

Primary Examiner—Melvyn I. Marquis
Assistant Examiner—K. Dean
Attorney, Agent, or Firm—Robert Spector

[57] ABSTRACT

Adhesion additives for curable organosiloxane compositions comprise (I) a silane containing at least one alkoxy or enoloxy group, the remaining valences of the silicon atom being satisfied by groups bonded to silicon through oxygen and containing at least one $H_2C=CR-$ radical, where R is hydrogen or monovalent hydrocarbon, and (II) at least one organosilicon compound comprising (a) at least one group capable of participating in a hydrosilation reaction, and (b) at least one silicon-bonded alkoxy, enoloxy or silanol group.

13 Claims, No Drawings

ADHESION PROMOTING ADDITIVES AND LOW TEMPERATURE CURING ORGANOSILOXANE COMPOSITIONS CONTAINING SAME

BACKGROUND OF THE INVENTION

Field of the Invention

This invention relates to adhesion promoting additives for organosiloxane compositions. More particularly this invention relates to combinations of additives that improve the adhesion of these organosiloxane compositions to a variety of inorganic and organic substrates, particularly glass, metals and plastics, at curing temperatures below 100° C. The additives are particularly suitable for use with organosiloxane compositions that cure by a platinum group metal catalyzed hydrosilation reaction.

Organosiloxane compositions, particularly those that cure by a platinum-catalyzed hydrosilation reaction, and the properties of the cured materials obtained from these compositions are desirable for a variety of end use applications, particularly in the electrical and electronics areas. The cured materials are useful as protective coatings, potting materials and encapsulants for integrated circuits and other electronic devices and as coatings for printed circuit boards.

A shortcoming of organosiloxane compositions that cure by a hydrosilation reaction is their inability to adhere strongly to many substrates, particularly plastics and certain metals. One method for remedying this deficiency is by using primer compositions or adhesion promoting additives containing silanes and organosiloxanes with a plurality of silicon-bonded hydrolyzable groups and at least one organofunctional substituent that is bonded to silicon through at least one carbon atom. Primer compositions are applied to substrates to which adhesion is desired prior to application of the curable organosiloxane composition. Adhesion promoters are present in the curable organosiloxane composition.

Adhesion additives typically contain at least two functional groups.

U.S. Pat. No. 4,196,273 teaches using unsaturated alkoxysilanes, however, adhesion is not demonstrated at temperatures below 100° C. and only adhesion to glass is demonstrated at 100° C.

U.S. Pat. No. 4,082,726 describes organosilicon compounds containing epoxy functional dialkoxysilyl groups and at least one silicon-bonded alkenyl radical or silicon-bonded hydrogen atom. Adhesion with compositions containing these compounds is demonstrated after cure between 100°–200° C. U.S. Pat. No. 4,087,585 teaches physical blends of epoxy functional alkoxysilanes with silanol functional fluids containing alkenyl functionality. Cure was obtained at elevated temperatures.

Using multifunctional organosilanes containing ethylenic unsaturation, epoxy functionality, and alkoxy functionality as adhesion promoters is taught in U.S. Pat. No. 4,732,932.

U.S. Pat. No. 4,659,851, U.S. Pat. No. 4,719,262, and U.S. Pat. No. 4,906,686 teach reaction products of unsaturated alcohols with alkoxysilanes.

U.S. Pat. No. 4,786,701 describes hydrolysis reaction products of tetraalkoxysilanes, alkenyl or silicon hydride functional organopolysiloxanes, and optional (meth)acryloxy functional alkoxysilanes. This patent does not demonstrate adhesion at temperatures below 100° C. or adhesion to two different types of substrates.

European Patent Publication (EPP) 449,181 teaches using organohydrogenpolysiloxanes containing at least two silicon-bonded hydrogen atoms and at least one trialkoxysilylalkyl group as the sole curing agent. Adhesion was demonstrated after cure at temperatures between 120°–150° C. Japanese Patent Publication 4/311,766 teaches using as adhesion promoters resins containing $SiO_{4/2}$ and $Si(OR)_3$ units, where OR is alkoxy, in addition to ethylenic functionality.

U.S. Pat. No. 4,912,188 teaches adhesion promoting additives that are linear organosilicon compounds containing ethylenically unsaturated hydrocarbon radicals, epoxy functionality, and optional alkoxy functionality at the terminus of the silicon compound. Compositions containing these compounds did not cure after 24 hours at room temperature. Adhesion was demonstrated after curing at 150° C.

U.S. Pat. No. 4,721,764 describes adhesion promoters that are organopolysiloxanes containing two silicon bonded hydrogen atoms and at least one silicon bonded hydrolyzable group or oxirane group.

EPP 458,355 teaches organohydrogenpolysiloxanes containing a linear sequence of at least five silicon atoms with each molecule containing at least three silicon-bonded hydrogen atoms, at least one epoxy group, and at least one trialkoxysilylalkyl group. Adhesion at temperatures below 120° C. is not demonstrated, and the organohydrogenpolysiloxane is the sole curing agent, which limits formulating latitude.

EPP 469,890 teaches organopolysiloxane compositions wherein at least one of the alkenyl or organohydrogenpolysiloxanes contains at least two alkoxy groups and/or at least one epoxy group in the molecule. The cured products were gels which were cured between 80°–150° C. Gels are known to have self adherent properties.

To summarize, examples of hydrolyzable groups that are present in known adhesion-promoting organosilicon compounds are alkoxy, carboxy such as acetoxy, ketoximo such as methylethylketoximo, and amido. The organofunctional group is typically one that will react with the substrate to which adhesion is desired. Examples of suitable organofunctional groups include but are not limited to alkenyl such as vinyl and allyl, mercaptoalkyl and (meth)acryloxyalkyl.

Three classes of silanes frequently used as adhesion promoting additives are epoxy-functional silanes such as 3glycidoxypropyltrialkoxysilanes, alkenyl-functional silanes such as vinyltrialkoxysilanes and alkyl silicates such as tetraethyl orthosilicate. These silanes can be at least partially replaced by their hydrolysis/condensation products.

SUMMARY OF THE INVENTION

This invention provides adhesion additives and organosiloxane compositions that cure by a hydrosilation reaction at temperatures below about 100° C. and contain these additives as a means to provide adhesion with good hydrolyric stability. The adhesion additives comprise (I) a silane or disiloxyalkane containing at least one alkoxy or enoloxy group, the remaining valences of the silicon atom(s) being satisfied by groups bonded to silicon through oxygen and containing at least one $H_2C=CR-$ radical, where R is hydrogen or monovalent hydrocarbon, and (II) at least one organosilicon compound comprising (a) at least one group capable of participating in a hydrosilation reaction, and (b) at least one silicon-bonded alkoxy or enoloxy group. The compositions optionally contain a compound capable of catalyzing the reaction of ingredient (I) and/or ingredient (II) with hydroxyl groups.

DETAILED DESCRIPTION OF THE INVENTION

This invention provides adhesion promoting additives for curable organosiloxane compositions, wherein the additives comprise (I) a first liquid organosilicon compound of a formula selected from the group consisting of $(R^1O)_aSi(OR^2)_{4-a}$ and $R^3[OSi(OR^2)_3]_2$, and (II) a second liquid organosilicon compound selected from the group consisting of
  (1) organosilanes wherein the silicon atom is bonded to
     (a) at least one alkoxy, enoloxy or silanol group and
     (b) at least one group capable of participating in a hydrosilation reaction; and
  (2) organosiloxanes comprising
     (a) units of the formula $R^{11}{}_dR^{12}{}_eSiO_{(4-d-e)/2}$, and
     (b) at least one silicon-bonded alkoxy, enoloxy or silanol group,
wherein
  said alkoxy groups contain from 1 to 4 carbon atoms;
  said enoloxy groups contain from 3 to 8 carbon atoms;
  $R^1$ represents a radical selected from the group consisting of
    Formula 1 $CH_2=C(R^4)CH_2R^8-$
    Formula 2 $CH_2=C(R^4)R^5OR^6-$
    Formula 3 $[CH_2=C(R^4)R^5O]_bR^9-$
    Formula 4 $[CH_2=C(R^4)]_bR^9-$
    Formula 5 $CH_2=C(R^4)R^8C(O)OR^6-$
    Formula 6 $CH_2=C(R^4)R^8OC(O)OR^6-$ and
    Formula 7 $CH_2=C(R^4)R^5OC(O)R^7-$;
each $OR^2$ is individually selected from the group consisting of alkoxy radicals containing from 1 to 4 carbon atoms and enoloxy radicals containing from 3 to 8 carbon atoms;
  $R^3$ represents a divalent radical selected from the group consisting of
    Formula 8 $CH_2=C(R^4)R^{10}=$
    Formula 9 $CH_2=C(R^4)R^5OR^{10}=$
    Formula 10 $CH_2=C(R^4)R^8C(O)OR^{10}=$
    Formula 11 $CH_2=C(R^4)R^8OC(O)OR^{10}=$ and
    Formula 12 $CH_2=C(R^4)R^5OC(O)R^{10}=$
wherein $R^4$ represents a hydrogen atom or an alkyl radical;
  $R^5$ represents a hydrocarbylene or substituted hydrocarbylene radical;
  $R^6$ is selected from the same group as $R^5$, with the proviso that
  $R^6$ contains at least two carbon atoms;
  $R^7$ is selected from the same group as $R^5$;
  $R^8$ is selected from the group consisting of single bonds and
  $R^9$ is selected from the group consisting of unsubstituted and substituted hydrocarbon radicals having a valence of $b+1$;
  $R^{10}$ is selected from the group consisting of unsubstituted and substituted trivalent hydrocarbon radicals;
  $R^{11}$ is selected from the group consisting of hydrogen and monovalent unsaturated groups bonded to silicon through carbon and capable of undergoing hydrosilation;
  $R^{12}$ is selected from the group consisting of monovalent unsubstituted and substituted hydrocarbon radicals;
  a is 1, 2 or 3
  b is 2 or 3;
  d is 1, 2, or 3; and
  e is 0, 1, or 2, with the proviso that the sum of d and e does not exceed 3.

The adhesion-promoting additives preferably include a catalyst for the reaction of (I) and/or (II) with hydroxyl groups.

This invention also provides curable organosiloxane compositions exhibiting adhesion to both organic and inorganic substrates following curing at temperatures below 100° C., said compositions comprising
  (A) a curable polyorganosiloxane;
  (B) an amount sufficient to cure said composition of a curing agent;
  (C) an amount sufficient to promote curing of said composition of a curing catalyst; and
  (D) an adhesion promoting additive of the present invention in an amount sufficient to develop adhesion between said composition and a substrate in contact with said composition during curing thereof at temperatures below 100° C.,
wherein said composition is cured using a reaction selected from the group consisting of hydrosilation reactions catalyzed by platinum group metals and compounds thereof; reactions of silicon-bonded hydrogen atoms with silanol groups; and, free radical reactions initiated by the decomposition of a photolyrically unstable compound.

As used in this specification the term "cure" means the conversion of a liquid or semi-solid composition to a crosslinked elastomeric or resinous material by the reaction of groups present on the polyorganosiloxane referred to as ingredient A of the present compositions with the curing agent.

The adhesion promoting additives can be used with organosiloxane compositions that cure by a variety of reactions.

One type of composition cures by a hydrosilation reaction catalyzed by metals from the platinum group of the periodic table and compounds of these metals.

Other curing reactions involve
  1) the reaction of silanol groups on a polyorganosiloxane with silicon-bonded hydrogen atoms on the curing agent in the presence of the same catalysts used for hydrosilation reactions, tin compounds or amines, particularly hydroxylamines;
  2) the generation of free radicals on the polyorganosiloxane initiated by the photoinduced decomposition in the presence of ultraviolet radiation of photosensitive compounds such as alphahydroxy ketones. This type of curing reaction typically does not require the presence of a curing catalyst.

The Adhesion Promoting Additive (Ingredient D)

The characterizing feature of the present organosiloxane compositions is an adhesion promoting additive containing two different classes of organosilicon compounds. One of these classes, referred to hereinafter as D1, contains at least one silicon-bonded alkoxy or enoloxy group, represented by $OR^2$ in the general formulae for this ingredient. The second class, referred to hereinafter as D2, also contains at least one siliconbonded alkoxy or enoloxy group, however at least a portion of these groups can be replaced with silanol groups.

Other types of silicon-bonded hydrolyzable groups such as ketoximo can be present in place of these preferred hydrolyzable groups so long as the additional hydrolyzable groups do not interfere with curing of the organosiloxane composition.

In addition to the hydrolyzable groups described in the preceding paragraph, compound D1 has at least one group bonded to silicon through oxygen and containing a carbon—to—carbon double bond of the formula $CH_2=C(R^4)-$, where $R^4$ is a hydrogen atom or monovalent hydrocarbon radical.

Ingredient D2 is a silane or siloxane containing (1) at least one hydrolyzable group or silanol group, and (2) at least one silicon-bonded hydrogen atom or ethylenically unsaturated group bonded to silicon through carbon that will participate in a hydrosilation reaction.

The ethylenically unsaturated groups in ingredient D2 can be vinyl or any of the unsaturated groups represented by $R^1$ and $R^3$ in the formula for ingredient D1.

As used in the present specification, monovalent hydrocarbon radicals include but are not limited to alkyl containing from 1 to about 20 carbon atoms, such as methyl, ethyl, n-hexyl and n-dodecyl; cycloalkyl such as cyclohexyl; aryl such as phenyl and naphthyl; aralkyl such as benzyl and alkaryl such as tolyl and xylyl.

Hydrocarbylene radicals typically contain from 1 to about 20 carbon atoms and include but are not limited to alkylene such as methylene, ethylene, butylene and undecylene, and arylene such as phenylene. Trivalent hydrocarbon radicals are typically branched aliphatic radicals containing from 4 up to 20 or more carbon atoms.

The hydrocarbon and hydrocarbylene radicals are either unsubstituted or can contain substituents that will not adversely affect the storage stability and curing of the present compositions or the properties of cured articles prepared from these compositions. Suitable substitutents include halogen atoms and tertiary amino groups wherein the nitrogen atom is bonded to three carbon atoms. The nitrogen atom of the amino group can be present on the linear portion of an alphatic hydrocarbon radical or on a branch.

The alkoxy groups represented by $OR^2$ in the formula of ingredient D1 contain from 1 to about 4 carbon atoms, and are most preferably methyl or ethyl.

When $OR^2$ is an enoloxy group it is represented by the formula $-OCR=CR\ R''$ where R represents an alkyl radical, and R' and R'' are individually selected from hydrogen atoms and alkyl radicals containing from 1 to 4 or more carbon atoms, with the proviso that the enoloxy group contains from 3 to 8 carbon atoms. R and R' can be joined to from a cycloalkenyl radical. Preferably R is methyl, R' and R'' are hydrogen and the enoloxy group is isopropenyloxy.

Ingredient D1 can be a silane represented by the general formula $(R^1O)_aSi(OR^2)_{4-a}$ or an alpha,omega-bis-siloxyalkane represented by the formula $R_3[OSi(OR^2)_3]_2$. The substituent identified as $R^1$ is bonded to silicon through an oxygen atom and contains at least four carbon atoms, two of which form an ethylenically unsaturated terminal group of the formula $CH_2=C(R^4)-$. The remainder of the $R^1$ substituent is composed of carbon, hydrogen and, optionally, oxygen atoms together with any substituents such as halogen and nitrogen that may be present on $R^1$. In one embodiment $R^1$ contains two or three unsaturated terminal groups. R4 is preferably hydrogen or methyl.

The substituent identified as $R^3$ in the preceding formula 2 is identical to $R^1$, except for the fact that it is divalent and bonded to two silicon atoms through oxygen.

The five embodiments of the $R^1$ and $R^3$ substituents defined in the preceding formulae 1 through 12 are described in detail hereinafter. In these embodiments $R^1$ is the residue remaining following removal of a hydroxyl group from one of four classes of organic compounds. $R^3$ is the residue remaining following removal of two hydroxyl groups from the same classes of compounds.

The five classes of organic compounds from which the substituents represented by $R^1$ and $R^3$ are derived are 1) terminally unsaturated alcohols, 2) ethers derived from the reaction of an alcohol of this type with either a saturated polyhydric alcohol or a polyhydric phenol, 3) esters derived from the reaction of a terminally unsaturated carboxylic acid with a saturated polyhydric alcohol, 4) mixed esters of carbonic acid derived from a terminally unsaturated alcohol and a saturated polyhydric alcohol, and 5) esters derived from reaction of a terminally unsaturated alcohol with a saturated hydroxycarboxylic acid containing aliphatic, cycloaliphatic or aromatic hydrocarbon radicals.

Ingredient D1 of the present compositions can be prepared by reacting one of the five classes of organic compounds described in the preceding paragraph with a silane containing silicon bonded alkoxy groups or an enoloxy group such as isopropenyloxy. The reaction products contain at least one alkoxy or enoloxy group per silicon atom.

Typically fi moles of the organic compound used to prepare ingredient D1 are reacted with each mole of the alkyl orthosilicate to prepare ingredients represented by the formula $(R^1O)_aSi(OR^2)_{4-a}$, wherein a is 1, 2, or 3.

When an organic compound containing two or more hydroxyl groups is reacted with one of the organosilicon compounds in a 1:2 molar ratio the resultant compound will be represented by the formula $R^3[OSi(OR^2)_3]_2$.

In one embodiment of ingredient D1, referred to as I, $R^1$ is $CH_2=C(R^4)CH_2R^8-$ and $R^3$ is $CH_2=C(R^4)R^{10}=$. In these formulae $R^4$ is a hydrogen atom or an alkyl radical, $R^8$ is a single bond or an unsubstitued or substituted hydrocarbylene radical that optionally contains at least one hydroxyl and/or alkoxy group and $R^{10}$ is a trivalent hydrocarbon radical. $R^4$ is preferably hydrogen or methyl.

$R^8$ preferably represents unsubstituted alkylene containing from 1 to 20 or more carbon atoms or unsubstituted cyclohexylene. Most preferably when $R^8$ is alkylene it contains from 6 to 12 carbon atoms.

In embodiment I, $R^1$ and $R^3$ represent the residue remaining following removal of one and two hydroxyl groups, respectively, from a terminally unsaturated alcohol. As used in this specification the term "terminally unsaturated" implies the presence of a hydrocarbon radical that includes a $CH_2=C(R^4)-$grouping at a terminal position.

Terminally unsaturated monohydric alcohols useful for preparing embodiment I of ingredient D1 contain from 3 to 20 or more carbon atoms, and include but are not limited to 3-buten-1-ol, 3-buten-2-ol, 2-methyl-3-buten-2-ol, 5-hexen-1-ol, 9-decylen-1-ol, 10-undecylen- 1-ol, 17-octadecylen-1-ol and the isomeric allyl substituted cyclohexanols.

Terminally unsaturated polyhydric alcohols or partial ethers thereof can be substituted for the monohydric alcohol. It will be understood that a terminally unsaturated alcohol containing at least two hydroxyl groups must be used to prepare compounds of this invention corresponding to the formula $R^{31}[OSi(OR^2)_3]_2$.

A second embodiment of ingredient D1, referred to hereinafter as II, is one wherein $R^1$ of the foregoing general formula is $CH_2=C(R^4)R^5OR^6-$, and $R^3$ is $CH_2=C(R^4)R^5OR^{10}=$. The radicals represented by $R^4$ and $R^{10}$ are defined in the preceding paragraphs, represents a $R^5$ hydrocarbylene or substituted hydrocarbylene radical and $R^6$ is selected from the same group as $R^5$ with the proviso that $R^6$ contain at least 2 carbon atoms. $R^5$ preferably contains from 1 to 12 carbon atoms and $R^6$ preferably contains from 2 to 20 carbon atoms.

In embodiment II, $R^1$ and $R^3$ represent the residues remaining following removal of one and two hydroxyl groups, respectively, from the saturated polyhydric alcohol portion of an ether derived from that alcohol and a terminally unsaturated alcohol containing at least one hydroxyl group. Preferably the unsaturated alcohol is monohydric.

The saturated polyhydric alcohol can be represented by the formula $HOR^6OH$. Preferably $R^6$ represents unsubstituted alkylene, hydroxyalkylene, cycloalkylene or phenylene, this preference being based on the availability of the corresponding alcohols. Suitable saturated polyhydric alcohols include but are not limited to ethylene glycol, the isomeric propylene glycols, glycerol, 1,1,1-trimethylolpropane, 1,4-cyclohexanediol and other alcohols containing at least two hydroxyl groups per molecule and up to 20 or more carbon atoms.

Partially etherified polyhydric alcohols containing three or more hydroxyl groups, at least two of which are unreacted, are also suitable precursors for the alcohol portion of compounds corresponding to embodiment II.

Suitable terminally unsaturated alcohols include those discussed in connection with embodiment I of ingredient D1 in addition to allyl alcohol.

In an alternative of embodiment II, two hydroxyl groups of a trihydric alcohol such as 1,1,1-trimethylolpropane are reacted with a terminally unsaturated alcohol such as allyl alcohol In this version of embodiment II, $R^1$ is represented by the general formula $(CH_2=C(R^4)R^{50})_2R^9-$.

The third embodiment of ingredient D1, referred to as III, is derived from an alcohol containing two or three terminally unsaturated pairs of carbon atoms, and is represented by the formula $[CH_2=C(R^4)_bR^9-$. In this embodiment b is 2 or 3 and $R^9$ represents an unsubstituted or substituted hydrocarbon radical having a valence of b+1. In one species of this embodiment the polyunsaturated alcohol is prepared by reacting an unsaturated epoxide compound such as allyl glycidyl ether with a primary or secondary aliphatic amine that optionally contains ethylenic unsaturation.

In the fourth embodiment of the present compounds, referred to hereinafter as embodiment IV, $R^1$ is defined as $CH_2=C(R^4)R^8C(O)OR^6-$ and $R^3$ is defined as $CH_2=C(R^4)R^8C(O)OR^{10}=$. $R^6$ is selected from the same group of hydrocarbylene radicals as defined hereinabove for $R^5$, with the proviso that $R^6$ contains at least two carbon atoms. $R^8$ is also selected from the same group of radicals as $R^5$ or it can represent a single bond and $R^9$ represents a trivalent hydrocarbon radical.

For the compounds of embodiment IV, $R^1$ and $R^3$ represent the residues remaining following removal of one and two hydroxyl groups, respectively, from the alcohol portion of an ester derived from reaction of a terminally unsaturated carboxylic acid with a saturated aliphatic or saturated cycloaliphatic alcohol containing at least two hydroxyl groups. Suitable saturated alcohols are discussed in connection with embodiment II.

The terminally unsaturated carboxylic acids used to prepare embodiment IV contain from 3 up to 20 or more carbon atoms. Representative members of this class include acrylic acid, 3-butenoic acid, 9-decenoic acid and 4-allylbenzoic acid.

In the fifth embodiment (V) of ingredient D1, $R^1$ is defined as $CH_2=C(R^4)R^8OC(O)OR^6-$ and $R^3$ is defined as $CH_2=C(R^4)R^8OC(O)OR^{10}=$. The formulae for this embodiment represent the residue resulting from the removal of 1 or 2 hydroxyl groups, respectively, from a mixed carbonate derived from equimolar quantities of carbonic acid, a terminally unsaturated monohydric alcohol and a polyhydric saturated alcohol or polyhydric phenol.

For the embodiments represented by the formula $R^3]OSi(OR^2)_3]_2$ it should be understood that the saturated polyhydric alcohol whose hydrocarbon portion is represented by $R^3$ must contain at least three unreacted hydroxyl groups.

In the sixth embodiment of ingredient D1, referred to hereinafter as VI, $R^1$ is defined as $CH_2=C(R^4)R^5OC(O)R^7-$ and $R^3$ is defined as $CH_2=C(R^4)R^5OC(O)R^{10}=$. In embodiment V, $R^7$ represents a hydrocarbylene radical selected from the same group as previously defined for $R^8$ and $R^{10}$ represents a trivalent hydrocarbon radical.

The $R^1$ and $R^3$ substituents of embodiment VI represent the residue remaining following removal of one and two hydroxyl groups, respectively, from the saturated or aromatic hydroxycarboxylic acid portion of an ester derived from that hydroxycarboxylic acid and at least one of the terminally unsaturated alcohols discussed in connection with embodiments I, II and IV of ingredient D1.

It will be understood that the hydroxycarboxylic acid must contain two or more hydroxyl groups per molecule to prepare a compound of this invention corresponding to the general formula $R^3[OSi(OR^2)_3]_2$. Hydroxycarboxylic acids of this type include dihydroxybenzoic acid and dihydroxycinnamic acid.

Hydroxycarboxylic acids useful for preparing compounds of embodiment VI include but are not limited to hydroxyacetic acid, lactic acid and the isomeric hydroxybenzoic and dihydroxybenzoic acids.

Organosilicon compounds corresponding to any of the aforementioned five embodiments of ingredient D1 can be prepared by reacting an alkyl orthosilicate of the general formula $(R^2O)_4Si$ with one of the terminally unsaturated, hydroxylated organic compounds described as precursors for these embodiments in the preceding sections of this specification.

The reaction between the organic and organosilicon compounds used to prepare ingredient D1 is conducted under conditions that are typical for condensation reactions of alkoxy- and enoloxysilanes with hydroxylated organic compounds. These reactions are typically conducted under an inert, anhydrous atmosphere such as nitrogen at temperatures from ambient to 200° C. and may employ a catalyst. Useful catalysts include but are not limited to the titanium compounds described in a subsequent section of this specification.

The weight of catalyst typically constitutes from about 0.1 to about 5 percent of the combined weight of all reactants.

Reactions involving exchanges of silicon bonded alkoxy and enoloxy groups typically generate the alcohol or ketone corresponding to the original silicon-bonded alkoxy or enoloxy group as a by-product. Because these reactions are often reversible, it is usually desirable to remove this by-product alcohol or ketone by distillation as the reaction progresses.

The course of exchange reactions involving the generation and removal of alcohol and ketone by-products can readily be followed by measuring the amount of by-product collected.

Methanol and ethanol are the lowest boiling alcohols, and it is therefore preferable that the alkoxy groups of the present organosilicon reactants, represented by $OR^2$ in the foregoing formulae 1–4, be methoxy or ethoxy. For the same reason, the enoloxy group is preferably isopropenyloxy.

The reactants and catalyst are heated for a period of time sufficient to achieve a substantially complete reaction, as indicated by the amount of by-product alcohol or ketone collected. This time period is typically from 1 to about 5 hours and the reaction mixture is preferably heated from about 50 to 200° C.

It may be desirable to include in the reaction mixture a liquid diluent that may also function as a solvent for the reactants. Suitable diluents include aliphatic and aromatic hydrocarbons that are liquid at ambient temperature and boil within the range of from 50 to about 250° C. Representative diluents include hexane, heptane and liquid aromatic hydrocarbons such as toluene and xylene.

Some of the ethylenically unsaturated organic reactants used to prepare ingredient D1 will polymerize at the temperatures used to react them with the organosilicon compound. It may therefore be desirable to include in the reaction mixture an effective amount of a free radical scavenger such as hydroquinone to completely suppress or at least inhibit the tendency of the organic reactant to polymerize during preparation of the present compounds.

Those embodiments of ingredient D1 that boil below about 200° C. under ambient or reduced pressure can be isolated by distilling the product from the reaction mixture. Higher boiling products can be isolated using known chromatographic techniques with gases or liquids as the carrier.

In some instances the reaction mixture in which the compound is prepared can be used directly as ingredient D1 without isolation or purification.

The second ingredient of the present adhesion-promoting additive, referred to as ingredient D2, is an organosilicon compound containing at least one group that participates in a hydrosilation reaction and at least one silanol or silicon-bonded hydrolyzable group.

Ingredient D2 is a silane that can be represented by the formula $R^{11}_dR^{12}_eSi(OX)_{4-d-e}$ or an organosiloxane wherein at least a portion of the siloxane units are of the formula $R^{11}_dR^{12}_eSiO_{(4-d-e)/2}$ and $(OX)_fR^{12}_gSiO_{(4-f-g)/2}$. In these formulae $R^{11}$ is selected from the group consisting of hydrogen and monovalent ethylenically unsaturated groups capable of undergoing hydrosilation, $R^{12}$ is a monovalent unsubstituted or substituted hydrocarbon radical, d and f are 1, 2, or 3; e and g are 0, 1 or 2 and the sums of both d+e and f+g do not exceed 3.

OX represents hydroxyl, an alkoxy group containing from 1 to 4 carbon atoms, or an enoloxy group. As in the case of ingredient D1, the alkoxy or enoloxy groups can be replaced by other hydrolyzable groups so long as these alternative groups do not interfere with curing or storage stability of the organosiloxane compositions containing the present adhesion promoting additives.

When ingredient D2 is a siloxane, preferably more than one siloxane unit containing an $R^{11}$ substituent is present, and these substituents can be identical or different. Ethylenically unsaturated substituents that can be represented by $R^{11}$ include but are not limited to ethylenically unsaturated hydrocarbon radicals containing from 2 to 20 carbon atoms, such as vinyl, allyl, 5-hexenyl, 10-undecylenyl, and the terminally unsaturated groups represented by $R^1$ in the formula for ingredient D1.

$R^{11}$ is preferably hydrogen, alkenyl or 3-methacryloxypropyl and $R^{12}$ is preferably alkyl containing from 1 to 4 carbon atoms, these preferences being based on the cost and availability of the organosilicon compounds required to prepare these ingredients.

In addition to the silanol and/or hydrolyzable groups and the substituents capable of participating in a hydrosilation reaction, ingredient D2 can contain adhesion-promoting reactive groups, such as epoxide groups, that are bonded through carbon to the silicon atoms of this ingredient, so long as these adhesion promoting groups do not interfere with curing or storage stability of organosiloxane composition containing this ingredient.

Epoxy-substituted hydrocarbon radicals that can be present on ingredient D2 include but are not limited to glycidoxypropyl and 4-epoxycyclohexylethyl.

In preferred embodiments of ingredient D2 the silicon atom containing the alkoxy or enoloxy group represented by —$OR^2$ is part of a siloxane unit of the formula

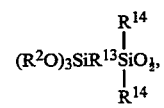

wherein $R^{13}$ represents an alkylene radical, $R^{14}$ represents a monovalent unsubstituted or substituted hydrocarbon radical, and each molecule of ingredient D2 contains from one to ten or more silicon-bonded hydrogen atoms.

The molecular structure of the organosiloxane used as ingredient D2 can be linear or branched. In addition to the required siloxane units, ingredient D2 typically contains one or more types of additional siloxane units represented by the general formula $R^{15}_hSiO_{(4-h)/2}$, wherein each $R^{15}$ is individually selected from the group consisting of monovalent unsubstituted and substituted hydrocarbon radicals and h is 0, 1, 2, or 3.

In preferred embodiments of ingredient D2 $R^{15}$ is preferably alkyl containing from 1 to 4 carbon atoms, haloalkyl containing from 1 to 4 carbon atoms or phenyl. Most preferably at least one of the hydrocarbon radicals present on each siloxane unit is methyl and any remaining hydrocarbon radicals are phenyl and/or 3,3,3-trifluoropropyl. When siloxane units of the formula $SiO_{4/2}$ are present these can constitute up to about 50 percent of the siloxane units present in ingredient D2.

Methods for preparing organosiloxanes suitable for use as ingredient D2 of the present compositions are described in the art. One method comprises the cohydrolysis of two or more silanes containing hydrolyzable groups. At least one of these silanes contains an ethylenically unsaturated hydrocarbon radical or silicon-bonded hydrogen atom. For example, a siloxane containing the optional epoxy group is prepared by the cohydrolysis of dimethylmethoxysilane, one or more types of cyclic dimethylsiloxanes and 3-glycidoxypropyltrimethoxysilane.

Embodiments of ingredient D2 containing trialkoxysilylalkyl groups can be prepared by reacting an organosiloxane copolymer comprising dimethylvinylsiloxy and $SiO_{4/2}$ units with a silane such as triethoxysilane containing a silicon-bonded hydrogen atom and three hydrolyzable groups. The reaction is conducted in the presence of a hydrosilation catalyst.

Silanes that can be used as ingredient D2 contain at least one silicon-bonded hydrogen atom or ethylenically unsaturated hydrocarbon radical and at least one silicon-bonded hydrolyzable group or silanol group.

Suitable ethylenically unsaturated groups include but are not limited to vinyl, allyl, 5-hexenyl, 10-undecylenyl, and 3-(meth)acryloxypropyl.

Preferred silanes include but are not limited to vinyltrimethoxysilane, vinyltriethoxysilane, 5-hexenyltrimethoxysilane and 3-methacryloxypropyltrimethoxysilane.

The concentrations of adhesion promoting additives D1 and D2 are sufficient to provide a level of adhesion to the cured composition that will withstand immersion in water. This typically requires at least about 1 weight percent, based on the weight of the curable composition, of the combination of ingredients D1 and D2. Concentrations of between 2.5 and 10 weight percent are preferred.

The ability of the organosiloxane composition to cure completely under the desired conditions andor the properties of the cured composition can be adversely affected when the combined concentrations of ingredients D1 and D2 exceeds about 10 weight percent, based on the weight of the curable composition.

Ingredient D1 typically constitutes from 50 to 90 weight percent, preferably from 60 to 80 weight percent, of the entire adhesion promoting additive, referred to as ingredient D of the present compositions.

In addition to ingredients D1 and D2 the adhesion promoting composition can also include an organotitanium compound or any of the other known catalysts that promote hydrolysis/condensation reactions of the silicon-bonded hydrolyzable groups present on ingredients D1 and D2 in the presence of moisture, so long as these catalysts do not substantially interfere with curing of the organosiloxane composition.

Suitable organotitanium compounds include but are not limited to tetraalkyl titanates such as tetra-isopropyl titanate and tetra-n-butyl titanate and chelated organotitanium compounds such as 2,5-diisopropoxy-bis-ethylacetoacetate titanium.

The present adhesion promoting additives improve the adhesion to a variety of substrates that is exhibited by organosiloxane compositions, particularly when these compositions are cured at temperatures below 100° C.

Suitable compositions cure by the reaction of silicon-bonded hydrogen atoms with either alkenyl radicals or silanol groups or by reaction with free radicals generated by the decomposition of photolytically unstable compounds such as alphahydroxy ketones.

The present adhesion promoting additives are particularly suitable for use with organosiloxane compositions that cure by a platinum group metal catalyzed hydrosilation reaction. The ingredients of these preferred curable compositions will now be discussed in detail.

The Alkenyl-Containing Polyorganosiloxane (Ingredient A)

The polyorganosiloxane referred to as ingredient A of preferred curable organosiloxane compositions of this invention is the principal ingredient of these compositions. This ingredient must contain at least two silicon-bonded alkenyl radicals in each molecule. Suitable alkenyl radicals contain from 1 to about 10 carbon atoms and are exemplified by but not limited to vinyl, allyl and 5-hexenyl. The silicon-bonded organic groups other than alkenyl radicals present in ingredient A are typically monovalent hydrocarbon and halogenated hydrocarbon radicals exemplified by but not limited to alkyl radicals such as methyl, ethyl and propyl; aryl radicals such as phenyl; and halogenated alkyl radicals such as 3,3,3-trifluoropropyl.

The molecular structure of ingredient A is not critical to the present invention, and will be determined by the physical properties desired in the cured composition. To achieve a useful level of tensile properties in the elastomers and other products prepared by curing the present compositions, the molecular weight of this ingredient should be sufficient to achieve a viscosity at 25° C. greater than about 0.1 Pa.s.

The upper limit for the molecular weight of ingredient A is not specifically restricted, and is typically limited only by the processability of the curable organosiloxane composition. The polyorganosiloxanes range from pourable liquids to gum type polymers that are typically characterized by Williams plasticity values.

When ingredient D2 contains at least two alkenyl radicals, this portion of the adhesion promoting additive also participates in the curing reaction, thereby reducing the concentration of ingredient A required to achieve a given physical property profile.

Preferred embodiments of ingredient A are polydiorganosiloxanes represented by the general formula I

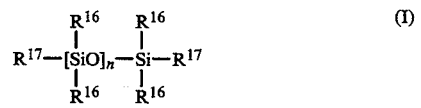

where each $R^{16}$ is individually selected from monovalent hydrocarbon radicals and monovalent halohydrocarbon radicals, $R^{17}$ represents a vinyl or other alkenyl radical, and n represents a degree of polymerization equivalent to a viscosity of at least 100 centipoise (0.1 Pa.s), preferably from 0.1 to 10 Pa.s.

The two $R^{16}$ substituents on each of the silicon atoms in formula I can be identical or different, and can contain from 1 to about 20 carbon atoms. A range of from 1 to 10 carbon atoms is preferred based on the availability of the corresponding monomers. Most preferably at least one of the hydrocarbon radicals on each silicon atom is methyl, and any remainder are vinyl, phenyl and/or 3,3,3-trifluoropropyl, this preference being based on the availability of the reactants typically used to prepare the polydiorganosiloxane and the properties of cured elastomers prepared from these polydiorganosiloxanes. For the same reasons, $R^{17}$ is preferably vinyl or 5-hexenyl.

Representative embodiments of ingredient A containing ethylenically unsaturated hydrocarbon radicals only at the terminal positions include but are not limited to dimethylvinylsiloxy-terminated polydimethylsiloxanes, dimethylvinylsiloxy-terminated polymethyl-3,3,3-trifluoropropylsiloxanes, dimethylvinylsiloxy-terminated-dimethylsiloxane/3,3,3-trifluoropropylmethylsiloxane copolymers and dimethylvinylsiloxy-terminateddimethylsiloxane/methylphenylsiloxane copolymers.

Methods for preparing ingredient A of the present compositions by hydrolysis and condensation of the corresponding halosilanes or by condensation of the cyclic polydiorganosiloxanes are sufficiently disclosed in the patent and other literature that a detailed description in thie specification is not necessary.

For applications requiring high levels of physical properties such as tear strength it may be desirable to include in the curable organosiloxane composition a second polydiorganosiloxane containing ethylenically unsaturated hydrocarbon radicals bonded to both terminal and non-terminal silicon atoms.

The Organohydrogensiloxane Curing Agent

(Ingredient B)

The preferred curable organosiloxane compositions of this invention contain at least one organohydrogensiloxane that functions as a curing agent for ingredient A. In the presence of the hydrosilation catalyst, referred to as ingredient C, the silicon-bonded hydrogen atoms in ingredient B undergo an addition reaction, referred to as hydrosilation, with the silicon-bonded alkenyl groups in ingredient A, resulting in crosslinking and curing of the composition.

Ingredient B must contain at least 2 silicon-bonded hydrogen atoms in each molecule. If ingredient A contains only two alkenyl radicals per molecule, ingredient B must contain an average of more than two silicon-bonded hydrogen atoms to achieve a crosslinked structure in the final cured product. The siliconbonded organic groups present in ingredient B are selected from the same group of monovalent hydrocarbon and halogenated hydrocarbon radicals as the organic groups of ingredient A, with the proviso that the organic groups in ingredient B must be substantially free of ethylenic or acetylenic unsaturation. The molecular structure of ingredient B can be straight chain, branch-containing straight chain, cyclic, or network.

While the molecular weight of ingredient B is not specifically restricted, viscosities in the range of 3 to 10,000 centipoise (0.003 to 10 Pa.s) at 25 degrees Centigrade are preferred.

The concentration of ingredient B is sufficient to provide a molar ratio of silicon-bonded hydrogen atoms to alkenyl radicals in the curable composition of from 0.5 to 20. A range of from 0.5 to 2 is preferred.

When the curable composition contains less than 0.5 moles of silicon-bonded hydrogen atoms per mole of alkenyl radicals it may not be possible to achieve the desired physical properties following curing. The physical properties of the cured article may vary with time when this ratio exceeds about 20 moles of silicon-bonded hydrogen per mole of alkenyl radicals.

When ingredient D2 is an organosiloxane containing at least two silicon-bonded hydrogen atoms per molecule, the presence of this ingredient will typically reduce the quantity of ingredient B required to achieve a given physical property profile in cured articles prepared using the present compositions. In some instances the concentration of silicon- bonded hydrogen atoms contributed by ingredient D2 may be sufficient to completely cure the composition without the need for any additional curing agent.

The Platinum-Containing Hydrosilation Reaction Catalyst

(Ingredient C)

Curing of the preferred organosiloxane compositions is catalyzed by a hydrosilation catalyst that is a metal from the platinum group of the periodic table or a compound of such a metal. These metals include platinum, palladium and rhodium. Platinum and platinum compounds are preferred based on the high activity level of these catalysts in hydrosilation reactions.

Examples of preferred curing catalysts include but are not limited to platinum black, platinum metal on various solid supports, chloroplatinic acid, alcohol solutions of chloroplatinic acid, and complexes of chloroplatinic acid with liquid ethylenically unsaturated compounds such as olefins and organosiloxanes containing ethylenically unsaturated hydrocarbon radicals bonded to silicon. Complexes of chloroplatinic acid with the aforementioned organosiloxanes containing ethylenically unsaturated hydrocarbon radicals are described in U.S. Pat. No. 3,419,593, which issued to David N. Willing on Dec. 31, 1968. The relevant portions of this patent are incorporated herein by reference as a teaching of preferred catalysts.

The concentration of ingredient C in the present compositions is equivalent to a platinum concentration of from 0.1 to 500 parts by weight of platinum metal, preferably from 1 to 50 parts by weight of platinum metal, per million parts (ppm), based on the combined weight of ingredients A and B.

Curing does not proceed satisfactorily at below 0.1 ppm of platinum, while using more than 500 ppm results in no appreciable increase in cure rate, and is therefore uneconomical.

Optional Ingredients

Platinum Catalyst Inhibitors

Mixtures of the aforementioned ingredients A, B and C may begin to cure at ambient temperature. To obtain a longer working time or "pot life", the activity of the catalyst under ambient conditions can be retarded or suppressed by addition of a suitable inhibitor.

Known platinum catalyst inhibitors include the acetylenic compounds disclosed in U.S. Pat. No. 3,445,420, which issued on May 20, 1969 to Kookootsedes et al. Acetylenic alcohols such as 2-methyl-3-butyn-2-ol constitute a preferred class of inhibitors that will suppress the activity of a platinum-containing catalyst at 25° C. Compositions containing these catalysts typically require heating at temperatures of 70° C. or above to cure at a practical rate.

When it is desired to increase the pot life of a curable composition under ambient conditions, this can be accomplished using an alkenyl substituted siloxane of the type described in U.S. Pat. No. 3,989,667, which issued on Nov. 2, 1976 to Lee and Marko. Cyclic methylvinylsiloxanes are preferred.

Inhibitor concentrations as low as one mole of inhibitor per mole of platinum will in some instances impart satisfactory storage stability and cure rate. In other instances inhibitor concentrations of up to 500 or more moles of inhibitor per mole of platinum are required. The optimum concentration for a given inhibitor in a given composition can readily be determined by routine experimentation and does not constitute part of this invention.

Reinforcing Fillers

To achieve high levels of tear strength and other physical properties that characterize some types of cured elastomers that can be prepared using the compositions of this invention, it may be desirable to include a reinforcing filler such as finely divided silica. Silica and other reinforcing fillers are often treated with one of more of the known filler treating agents to prevent a phenomenon referred to as "creping" or "crepe hardening" during processing of the curable composition.

Finely divided forms of silica are preferred reinforcing fillers. Fumed silicas are particularly preferred because of their relatively high surface area, which is typically at least 50 square meters per gram. Fillers having surface areas of at least 200 square meters per gram are preferred for use in the present method.

The amount of finely divided silica or other reinforcing filler used in the present compositions is at least in part determined by the physical properties desired in the cured elastomer. Liquid or pumpable polyorganosiloxane compositions typically contain from about 10 to about 60 percent by weight of silica, based on the weight of polydiorganosiloxane. This value is preferably from about 30 to about 50 percent.

The filler treating agent can be any of the low molecular weight organosilicon compounds disclosed in the art as being suitable for preventing creping of organosiloxane compositions during processing. The treating agents are typically liquid hydroxyl terminated polydiorganosiloxanes containing an average of from 2 to about 20 repeating units per molecule, and organosilicon compounds such as hexaorganodisiloxanes and hexaorganodisilazanes that hydrolyze and condense under the conditions used to treat the filler. Preferably at least a portion of the silicon bonded hydrocarbon radicals present on the treating agent are identical to a majority of the hydrocarbon radicals present in ingredients A and B. A small amount of water can be added together with the silica treating agent(s) as a processing aid.

It is believed that the treating agents function by reacting with silicon-bonded hydroxyl groups present on the surface of the silica or other filler particles to reduce interaction between these particles and the polyorganosiloxanes present in the curable composition.

When a silica filler is used, it is preferably treated in the presence of at least a portion of the other ingredients of the present compositions by blending these ingredients together until the filler is completely treated and uniformly dispersed to form a homogeneous material.

The ingredients that are present during treatment of the filler typically include the silica treating agents and at least a portion of the polydiorganosiloxane(s) referred to herein as ingredient A.

Additional Optional Ingredients

The present organosiloxane compositions can contain one or more additives that are conventionally present in curable compositions of this type to impart or enhance certain physical properties of the cured composition in addition to adhesion or to facilitate processing of the curable composition.

Typical additives include but are not limited to non-reinforcing fillers such as quartz, alumina, mica and calcium carbonate; pigments such as carbon black and titanium dioxide; dyes, flame retardants, and heat and/or ultraviolet light stabilizers. Resinous organosiloxane copolymers can be used in place of or in combination with one or more reinforcing fillers to improve the physical properties of the cured organosiloxane composition.

A preferred type of resinous copolymer contains repeating units of the general formula $SiO_{4/2}$ in addition to triorganosiloxy units of the general formulae $R^{18}{}_3SiO_{\frac{1}{2}}$ and diorganovinylsiloxy units of the general formula $CH_2{=}CH(R^{19})_2SiO_{\frac{1}{2}}$. In these formulae $R^{18}$ and $R^{19}$ are individually monovalent hydrocarbon or substituted monovalent hydrocarbon radicals as previously defined for the $R^{17}$ radicals of ingredient A.

The molar ratio of the combination of triorganosiloxy units and diorganovinylsiloxy units to $SiO_{4/2}$ units in the resinous copolymer is from 0.7 to 1.2, inclusive. The vinyl-containing units constitute from 2 to 8 percent by weight of the copolymer, which preferably contains at least two vinyl radicals per molecule. In preferred embodiments of the copolymer the ranges for the molar ratio of diorganovinylsiloxy: triorganosiloxy:$SiO_{4/2}$ units is 0.08–0.1:0.06–1:1.

The resinous copolymers can be prepared as described in U.S. Pat. No. 2,676,182, which issued to Daudt and Tyler on Apr. 20, 1954 and is hereby incorporated in this specification by reference thereto as a teaching of the copolymers and a method for preparing them. The copolymers described in this patent contain from 2 to 23 percent by weight of hydroxyl groups, which is considerably above the maximum level of about 0.8 weight percent preferred for precursors of the present copolymers. The hydroxyl content of the precursor can be conveniently reduced to the desired level by employing a higher concentration of triorganosiloxy units than the concentration range taught by Daudt et al.

Briefly, the method of Daudt et al. comprises reacting a silica hydrosol under acidic conditions with the appropriate amount of hexamethyldisiloxane or trimethylchlorosilane. The resinous copolymers used to prepare the present elastomers can be obtained by reacting Daudt et al's. product with the required amount of a hexaorganodisilazane or a hexaorganodisiloxane wherein each silicon atom contains a vinyl radical and two methyl or other hydrocarbon radicals represented by $R^{18}$ and $R^{19}$ in the foregoing formula.

Preparation of Curable Compositions

The compositions of this invention can be prepared by combining all of ingredients at ambient temperature. Any of the mixing techniques and devices described in the prior art can be used for this purpose. The particular device used will be determined by the viscosity of the ingredients and the final curable composition. Suitable mixers include but are not limited to paddle type mixers, kneader type mixers and two- and three-roll rubber mills.

Cooling of the ingredients during mixing may be desirable to avoid premature curing of the composition.

To maximize storage stability the curable compositions are preferably kept in closed containers until used. If greater storage stability is desired, the compositions can be packaged in two or more containers with the organohydrogensiloxane (ingredient B) and the platinum group metal catalyst in separate containers.

Depending upon the types and concentrations of ingredients A and B, cured organosiloxane materials prepared using the present compositions can vary in properties from brittle resins to elastomers to gels, and are useful in a variety of end-use applications as coatings or as molded or extruded articles. Unfilled materials are particularly useful as adhesives, protective coatings, encapsulants and potting compositions for protecting delicate electronic devices such as transistors and integrated circuits from damage by moisture and other materials present in the environment that can adversely affect operation of the device. The compositions can be used to coat either the individual devices or a circuit board containing a number of these devices together with other electronic components.

The present compositions can be applied to substrates by spraying, dipping, pouring, extrusion or by the use of a brush, roller or coating bar. The selection of a particular application method will be determined at least in part by the viscosity of the curable composition. The viscosity of the composition can be reduced using suitable solvents or reactive diluents as known in the art.

Curing of the present compositions commences when ingredients A, B and C are combined. One advantage of the present adhesion promoting compositions is the absence of substantial retardation of the curing reaction.

Organosiloxane compositions containing the present adhesion additives cohesively bond to a variety of organic and inorganic substrates during curing at temperatures as low as 25° C. The ability of the present compositions to develop adhesion when cured at these relatively low temperatures makes them suitable for application to substrates that cannot withstand the elevated temperatures of 100° C. or higher required to cure organosiloxane compositions containing prior art adhesion additives such as epoxide compounds.

Preferred compositions cure over a period of several hours under ambient conditions. As is true for other compositions that cure by a platinum-catalyzed hydrosilation reaction, curing can be accelerated by heating. Curing temperatures of from 25 to about 80° C. are preferred.

The present adhesion promoting additives are also useful as primer compositions in combination with organosiloxane compositions that cure by reactions other than hydrosilation. One of the more common curing reactions for organosiloxane compositions is reaction of silanol-containing polyorganosiloxanes with silanes containing at least three silicon-bonded alkoxy or other hydrolyzable groups per molecule. The adhesion promoter can also be present as an additive in the curable organosiloxane composition.

Unlike many prior art adhesion promoters, the initial adhesion imparted by preferred adhesion additives of this invention is not adversely affected to any substantial extent when substrates coated using the present compositions are exposed to moisture. This is particularly desirable when the compositions are used to coat and seal electronic devices such as semiconductor devices and integrated circuits whose performance can be adversely affected by moisture and other contaminants to which these devices can be exposed to during use.

EXAMPLES

The following examples describe preferred curable compositions of the present invention and should not be interpreted as limiting the scope of the invention defined in the accompanying claims. Unless otherwise specified all parts and percentages in the example are by weight and viscosities were measured at 25° C.

The organotitanium compounds used as catalysts for reaction of the hydrolyzable groups present in ingredients D1 and D2 are either commercially available or were prepared by gradually adding over a 3 to 18 minute period an ethylenically unsaturated compound to tetraisopropyl titanate in a glass reactor equipped with a magnetically operated stirring bar. The reaction was conducted under a nitrogen atmosphere and was typically exothermic. The reaction mixture was heated following the exotherm to remove the alcohol formed as a by-product of the reaction.

Titanate 1 was prepared using 20 g. (70 mmol) of tetraisopropyl titanate and 28.2 g. (141 mmol) of diethylallylmalonate. The reaction mixture reached a temperature of 35° C. during the eight-minute addition period and was then heated to 175° C., during which time 3.9 g. of distillate were collected, indicating that only one ester group on the malonate reacted.

Titanate 2 was prepared using 30 g. (106 mmol) of tetraisopropyl titanate and a solution containing 10.8 g. (106 mmol) of vinyldimethylsilanol in 4.1 g. diethyl ether. The reaction mixture reached a temperature of 30° C. during the 5 minute addition and was heated to a temperature of 103° C. following completion of the addition, during which time 10.0 g. of distillate were collected.

Titanate 3 was prepared using 22.7 g. (80 mmol) of tetra-isopropyl titanate and 27.3 (160 mmol) of 10-undecen-1-ol. The reaction mixture reached a temperature of 34° C. during the 24 minute addition and was heated to a temperature of 108° C. for removal of the isopropyl alcohol.

Titanate 4 was tetra-isopropyl titanate.

Titanate 5 was tetrabutyl titanate.

Adhesion additive I (corresponding to additive D1 of the present compositions) was prepared using a procedure similar to the one described for preparing the organotitanium compounds. The reactor was charged with 31.36 g. (150 mmol) of tetraethyl orthosilicate and 0.11 g. of tetrabutyl titanate. The contents of the reactor were heated to about 80° C., at which time 25.58 g. (150 mmol) of 10-undecen-1-ol were added over 39 minutes. Ethanol was recovered by distillation during this period. The reaction mixture was heated to 129° C. following completion of the addition, and a total of 8.8 g. of distillate were collected and found to contain 80 weight percent ethanol and 20 weight percent tetraethyl orthosilicate when analyzed using gas liquid chromatography.

Adhesion additive II (corresponding to ingredient D1) was prepared using the same procedure described for additive I by reacting 55.05 g. (264 mmol) tetraethyl orthosilicate, 0.1 tetrabutyl titanate and 45.04 g. (265 mmol) 10-undecen-1-ol. The alcohol was added to a solution of the orthosilicate and the titanate at ambient temperature over 14 minutes, following which the reaction mixture was heated to a temperature of 126° C., during which time 8.3 g. of distillate were collected.

Adhesion additive III and IV, which correspond to ingredient D2 of the present compositions, were prepared by reaction of an organohydrogensiloxane with ally glycidyl ether and 5-hexenyltrimethoxysilane in the presence of a reaction product of platinic chloride and sym-tetramethyldivinyldisiloxane that had been diluted with sufficient toluene to achieve a platinum content of 0.99 weight percent.

The organohydrogensiloxane and 50 g. of toluene were placed in a glass reactor equipped with a magnetically operated stirring bar. A mixture of nitrogen and 4 weight percent of oxygen was circulated through the reactor using a delivery tube. After about 10 minutes the catalyst was added. The reaction mixture was then heated to 100° C. and the ethylenically unsaturated compounds added over a 1-2 hour interval.

The temperature of the reaction mixture was maintained at 100° C. following the addition until analysis using gas-liquid chromatography indicated that the reaction was at least 95 percent complete. Volatile liquids were then removed from the reactor at about 100° C. and a pressure less that 10 mmHg.

Adhesion additive III was prepared using 33.93 g. of a trimethylsiloxy-terminated polydiorganosiloxane having an average of five methylhydrogensiloxane units and three dimethylsiloxane units per molecule with a silicon-bonded hydrogen atom content of about 0.8 weight percent, 5.83 g. allylglycidyl ether and 10.24 g. hexenyltrimethoxysilane and 29 microliters of catalyst solution.

Adhesion additive IV was prepared using 30.79 g. of a dimethylhydrogensiloxane/$SiO_{4/2}$ copolymer containing 1 weight percent of silicon-bonded hydrogen, 6.96 g. allylglycidyl ether, 12.25 g. hexenyltrimethoxysilane and 29 microliters of catalyst solution.

The amounts of reactants used to prepare adhesion additives III and IV were equivalent to reacting 20 percent of the available silicon-bonded hydrogen atoms with the epoxide compound and 20 percent with the hexenyltrimethoxysilane.

Adhesion additive V was hexenyltrimethoxysilane that had been freshly distilled from sodium methoxide.

EXAMPLE 1

This example demonstrates the high level of adhesion imparted by preferred adhesion additives, and the ability of compositions containing these additive to retain adhesion to glass, aluminum and epoxy-impregnated fiberglass substrates during immersion of the coated substrates in water.

The curable polyorganosiloxane (ingredient A) was a dimethylvinylsiloxy-terminated polydimethylsiloxane exhibiting a viscosity of 2200 centipoise (2.2 Pa.s); the organohydrogensiloxane (ingredient B) was a trimethylsiloxy-terminated polydiorganosiloxane having an average of five methylhydrogensiloxane units and three dimethylsiloxane units per molecule with a silicon-bonded hydrogen atom content of about 0.8 weight percent; and the platinum catalyst was a reaction product of hexachloroplatinic acid and sym-tetramethyldivinyldisiloxane that had been diluted with a liquid dimethylvinylsiloxy terminated polydimethylsiloxane in an amount sufficient to achieve a platinum content of 0.6 weight percent. The catalyst was present at a concentration of 0.253 parts in all of the compositions.

The sample numbers in table 1 containing the letter C were comparative samples that are outside the scope of the present invention.

TABLE 1

| Sample | Ingredient (Parts) A | B | I | III | Ti Catalyst (Type/Parts) |
|---|---|---|---|---|---|
| C1 | 141 | 4.2 | 4.5 | 0 | 1/0.4 |
| 1 | 142 | 2.4 | 3.0 | 3.0 | 1/0.4 |
| C2 | 139 | 4.6 | 4.5 | 0 | 1/1.5 |
| 2 | 139 | 2.8 | 3.0 | 3.0 | 1/1.5 |
| C3 | 139 | 4.6 | 4.5 | 0 | 3/1.5 |
| 3 | 139 | 2.8 | 3.0 | 3.0 | 3/1.5 |
| C4 | 141 | 4.2 | 4.5 | 0 | 4/0.4 |
| 4 | 142 | 2.4 | 3.0 | 3.0 | 4/0.4 |
| C5 | 140 | 4.6 | 4.5 | 0 | 4/1.5 |
| 5 | 140 | 2.4 | 3.0 | 3.0 | 4/1.5 |
| C6 | 140 | 4.3 | 4.5 | 0 | 2/0.4 |
| 6 | 142 | 2.4 | 3.0 | 3.0 | 2/0.4 |
| C7 | 139 | 4.8 | 4.5 | 0 | 2/1.5 |
| 7 | 139 | 3.0 | 3.0 | 3.0 | 2/1.5 |

The substrates on which the curable compositions were evaluated were glass microscope slides (glass), panels measuring 7.6 by 12.7 cm., formed from type 3003 H14 alloy mill finish aluminum available from Q-Panel (aluminum) and epoxy-bonded fiberglass panels measuring 7.6 by 12.7 cm., available as G-10 from Almac Plastics, Inc. (epoxy).

Films of each composition measuring 0.008 in (0.2 mm) were applied to each of the substrates using a draw-down bar. The coating were allowed to cure for one week under ambient conditions and tested to determine coating adhesion. The coated substrates were then immersed for seven days in deionized water heated at 70° C.

The adhesion tests consisted of scratching the cured coatings with the blade of a metal spatula to determine whether the coating could be removed without leaving a residue on the surface (adhesive failure) or whether failure occurred within the coating layer, resulting in at least a portion of the coating material in the test area adhering to the substrate (cohesive failure).

Coatings exhibiting cohesive failure were further tested to determine if the residue on the substrate and the adjacent coating material could be removed by rubbing with a finger. If the coating could be removed in this manner, the pressure required to remove the coating was rated on a subjective scale as slight (WE), medium (WM) or high (WD).

TABLE 2

| Sample | Glass Dry/Wet | Aluminum Dry/Wet | Epoxy Dry/Wet |
|---|---|---|---|
| C1 | CF/AF | CF/AF | AF/CF |
| 1 | CF/CF | CF/CF | AF/CF |
| C2 | CF/AF | CF/WM | AF/CF |
| 2 | CF/CF | CF/CF | CF/CF |
| C3 | CF/AF | CF/CF | WD/AF-CF |
| 3 | CF/AF | CF/CF | CF/CF |
| C4 | CF/AF | CF/WM | WE/CF |
| 4 | CF/CF | CF/CF | ND/CF |
| C5 | CF/AF | CF/CF | CF/CF |
| 5 | CF/CF | CF/CF | CF/CF |
| C6 | CF/AF | CF/CF | WM/CF |
| 6 | CF/CF | CF/CF | WM/CF |
| C7 | CF/AF | CF/WE | CF/CF |
| 7 | CF/WM | CF/CF | CF/CF |

AF-CF = Portions of coating exhibited adhesive failure, others exhibited cohesive failure.

EXAMPLE 2

This example demonstrates the ability of a filled organosiloxane composition containing the present adhesion promoters to retain excellent adhesion to a variety of substrates during immersion in water.

A curable organosiloxane composition was prepared by blending the following ingredients:

As ingredient A, 98 parts of a dimethylvinylsiloxy-terminated polydimethylsiloxane exhibiting a viscosity of 0.45 Pa.s;

As a filler, 93 parts of quartz exhibiting an average particle size of 5 microns;

As ingredient B, 6.0 parts of a trimethylsiloxy-terminated polydiorganosiloxane having an average of five methylhydrogensiloxane units and three dimethylsiloxane units per molecule with a silicon-bonded hydrogen atom content of about 0.8 weight percent;

As ingredient C, 0.2 part of a reaction product of hexachloroplatinic acid and sym-tetramethyldivinyl-disiloxane that has been diluted with a liquid dimethylvinylsiloxy terminated polydimethylsiloxane in an amount sufficient to achieve a platinum content of 0.6 weight percent;

0.9 parts of zinc oxide;
0.5 part of carbon black; and
0.1 part of cyclic methylvinylsiloxanes.

To the amount of this curable organosiloxane composition reported in Table 3 were added the types and amounts of adhesion-promoting ingredients listed in Table 3. The compositions also contained tetrabutyl titanate, identified in Table 3 as TBT, and additional amounts of the same organohydrogensiloxane (ingredient B) present in the curable composition. As in tables 1 and 2, comparative samples that are outside the scope of the present invention are identified by the letter "C".

TABLE 3

| Sample | Curable Composition (Parts) | Additional Ingredients (Parts) | | | | |
|---|---|---|---|---|---|---|
| | | B | TBT | II | IV | V |
| 8 | 288 | 1.7 | 0.315 | 3.1 | 3.1 | 3.1 |
| C8 | 296 | 1.2 | 0.305 | 3.1 | 0 | 0 |
| 9 | 286 | 4.6 | 0.305 | 6.1 | 0 | 2.9 |
| C9 | 278 | 6.2 | 0.300 | 14.9 | 0 | 0 |
| 10 | 291 | 1.0 | 0.330 | 6.1 | 3.1 | 0 |

The compositions were coated onto substrates, cured and the coatings tested for adhesion as described in Example 1 of this specification. In addition to the substrates described in Example 1 each of the compositions were coated on panels of bare aluminum available as type 2024 T3 from Q-Panel and copper plated epoxide panels. Both the aluminum and copper coated panels measured 2.5 by 7.6 cm.

The results of the adhesion tests are summarized in Table 4.

TABLE 4

| Sample | Glass Dry/Wet | Aluminum Alloy Dry/Wet | Bare Aluminum Dry/Wet | Epoxy Dry/Wet | Copper Dry/Wet |
|---|---|---|---|---|---|
| 8 | CF/CF | CF/CF | CF/CF | AF/CF | AF/CF |
| C8 | CF/AF | CF/CF | CF/AF | AF/AF | AF/AF |
| 9 | CF/CF | CF/CF | CF/CF | AF/CF | CF/CF |
| C9 | CF/AF | CF/CF | CF/WM | CF/CF | CF/CF |
| 10 | CF/CF | CF/CF | CF/CF | AF/CF | CF/CF |

The data in Table 4 demonstrate the imgroved adhesion exhibited by organosiloxane compositions containing the adhesion 15 promoting additives of the present invention. Only the compositions of the present invention (8, 9, and 10) exhibited cohesive failure to all substrates following immersion of the coated substrates in heated water.

That which is claimed is:

1. A curable organosiloxane composition comprising
   (A) a curable polyorganosiloxane;
   (B) an amount sufficient to cure said composition of a curing agent;
   (C) an amount sufficient to promote curing of said composition of a curing catalyst; and
   (D) an adhesion promoting additive in an amount sufficient to develop adhesion between said composition and a substrate in contact with said composition during curing thereof at temperatures below 100° C., said additive comprising (I) a first liquid organosilicon compound of a formula selected from the group consisting of $(R^1O)_aSi(OR^2)_{4-a}$ and $R^3[OSi(OR^2)_3]_2$, and (II) a second liquid organosilicon compound selected from the group consisting of
      (1): organosilanes wherein the silicon atom is bonded to (a) at least one alkoxy, enoloxy or silanol group and (b) at least one silicon-bonded hydrogen atom or ethylenically unsaturated group bonded to silicon through carbon that will participate in a hydrosilation reaction; and
      (2) organosiloxanes comprising (a) units of the formula $R^{11}{}_dR^{12}{}_eSiO_{(4-d-e)/2}$, and (b) units containing at least one silicon-bonded alkoxy, enoloxy or silanol group, wherein
   said alkoxy groups contain from 1 to 4 carbon atoms;
   said enoloxy groups contain from 3 to 8 carbon atoms;
   $R^1$ represents a radical selected from the group consisting of
      $CH_2=C(R^4)CH_2R^8$—;
      $CH_2=C(R^4)R^5OR^6$—;
      $[CH_2=C(R^4)R^5O]_bR^9$—;
      $[CH_2=C(R^4)]_bR^9$—;
      $CH_2=C(R^4)R^8C(O)OR^6$—;
      $CH_2=C(R^4)R^8OC(O)OR^6$— and
      $CH_2=C(R^4)R^5OC(O)R^7$—;
   each $R^2$ is individually selected from the group consisting of alkyl radicals containing from 1 to 4 carbon atoms, 1-alkenyl and 1-cycloalkenyl radicals;
   $R^3$ represents a divalent radical selected from the group consisting of
      $CH_2=C(R^4)R^{10}=$;
      $CH_2=C(R^4)R^5OR^{10}=$;
      $CH_2=C(R^4)R^8C(O)OR^{10}=$;
      $CH_2=C(R^4)R^8OC(O)OR^{10}=$; and
      $CH_2=C(R^4)R^5OC(O)R^{10}=$;
wherein
   $R^4$ represents a hydrogen atom or an alkyl radical;
   $R^5$ represents a hydrocarbylene or substituted hydrocarbylene radical;
   $R^6$ is selected from the same group as $R^5$, with the proviso that $R^6$ contains at least two carbon atoms;
   $R^7$ is selected from the same group as $R^5$;
   $R^8$ is selected from the group consisting of single bonds and $R^5$;
   $R^9$ is selected from the group consisting of unsubstituted and substituted hydrocarbon radicals with a valence of b+1;

$R^{10}$ is a trivalent hydrocarbon radical;

$R^{11}$ is selected from the group consisting of hydrogen and unsaturated groups bonded to silicon through carbon and capable of undergoing hydrosilation;

$R^{12}$ is selected from monovalent unsubstituted or substituted hydrocarbon radical;

a is 1, 2 or 3;

b is 2 or 3 d is 0, 1, 2 or 3; and e is 0, 1 or 2; with the proviso that the sum of d and e does not exceed 3, and wherein said composition is cured using a reaction selected from the group consisting of hydrosilation reactions catalyzed by platinum group metals and compounds thereof; reactions of silicon-bonded hydrogen atoms with silanol groups; and, free radical reactions initiated by the decomposition of a photolyrically unstable compound.

2. A composition according to claim 1 wherein $R^1$ is selected from $CH_2\!=\!C(R^4)CH_2R^8\!-$ or $CH_2\!=\!C(R^4)R^8C(O)OR^6\!-$;

$R^2$ contains from 1 to 20 carbon atoms;

$R^4$ is selected from hydrogen or methyl;

$R^5$ is alkylene containing from 1 to 12 carbon atoms;

$R^6$ is alkylene containing from 2 to 20 carbon atoms;

$R^8$ is alkylene containing from 6 to 12 carbon atoms;

said organosilanes are represented by the formula $R^{11}{}_d R^{12}{}_e Si(OX)_{4-d-e}$ wherein $R^{11}$ is selected from the group consisting of hydrogen, alkenyl, and 3-methacryloxypropyl;

$R^{12}$ is alkyl containing from 1 to 4 carbon atoms;

OX is selected from the group consisting of alkoxy, enoloxy and hydroxyl groups;

said composition contains an organotitanium compound; and said organosiloxane (D) (2) further comprises units of the formula $R^{15}{}_f SiO_{(4-f/2)}$, where each $R^{15}$ is individually selected from the group consisting of monovalent unsubstituted and substituted hydrocarbon radicals and f is 0, 1, 2 or 3, with the proviso that units wherein f is 0 do not constitute more than 50 percent of the units of said organosiloxane.

3. A composition according to claim 2 wherein $R^1$ is $CH_2\!=\!CHCH_2R^5$;

$R^2$ is selected from methyl, ethyl and isopropenyl, $R^5$ contains from 1 to 8 carbon atoms;

$R^6$ is selected from ethylene or propylene;

$R^{11}$ is selected from alkenyl or 3-methacryloxypropyl; and each $R^{15}$ is individually selected from the group consisting of alkyl containing from 1 to 4 carbon atoms, phenyl and 3,3,3-trifluoropropyl, with the proviso that at least one of the $R^{15}$ radicals on each silicon atom is methyl;

—OX is selected from the group consisting of hydroxyl, alkoxy containing from 1 to 4 carbon atoms and isopropenyloxy;

said (D) (2) organosiloxane further comprises an epoxyalkyl or an epoxycycloalkyl group bonded to silicon and from 1 to 10 siloxane units containing silicon-bonded hydrogen atoms;

said organotitanium compound is selected from the group consisting of tetraalkyl titanates and alkenyltrialkyl titanates;

and said adhesion-promoting additive constitutes at least 1 weight percent of said composition.

4. A composition according to claim 2 wherein $R^1$ is 10-undecenyl, $R^{11}$ is hydrogen, said organosiloxane (D) (2) further comprise siloxane units containing silicon-bonded 3-glycidoxypropyl groups, said units containing silicon-bonded alkoxy groups are $-[(CH_3O)_3SiC_6H_{12}](CH_3)SiO-$, and said adhesion promoting additive constitutes from 2.5 to 10 weight percent of said composition.

5. A composition according to claim ; wherein said first liquid organosilicon compound is $C11H_{21}OSi(OC_2H_5)_3$ and said second liquid organosilicon compound is the reaction product of an organohydrogensiloxane with less than a stoichiometric amount, based on the number of silicon-bonded hydrogen atoms in said organohydrogensiloxane, of a mixture of allylglycidyl ether and hexenyltrimethoxysilane.

6. A composition according to claim 1 wherein said composition cures by a hydrosilation reaction, said polyorganosiloxane is a polydiorganosiloxane exhibiting a viscosity greater than 0.1 Pa.s at 25° C. and containing at least two alkenyl radicals per molecule;

said curing agent is an organohydrogensiloxane exhibiting a viscosity at 25° C. of from 0,003 to 10 Pa.s;

the organic groups bonded to the silicon atoms of said polydiorganosiloxane and said organohydrogensiloxane are selected from the group consisting of monovalent unsubstituted and substituted hydrocarbon radicals;

the concentration of said organohydrogensiloxane is sufficient to provide a molar ratio of silicon-bonded hydrogen atoms to alkenyl radicals in said composition of from 0.5 to 2; and the curing catalyst is selected from the group consisting of platinum group metals and compounds of said metals and is present in said composition at a concentration equivalent to from 1 to 50 parts by weight of platinum group metal per million parts by weight of the combination of said polyorganosiloxane and said organohydrogensiloxane.

7. A composition according to claim 6 wherein said polyorganosiloxane exhibits the formula $$R^{17}-[SiO]_n-Si-R^{17} \quad \text{(I)}$$
with $R^{16}$ substituents on each Si wherein each $R^{16}$ is individually selected from monovalent hydrocarbon radicals and monovalent halohydrocarbon radicals, $R^{17}$ is an alkenyl radical, and n represents a degree of polymerization equivalent to a viscosity of from 0.1 to 10 Pa.s at 25° C.

8. A composition according to claim 7 wherein said composition is packaged in at least two containers with said organohydrogensiloxane and said catalyst located in separate containers.

9. An adhesion promoting composition for use with curable organosiloxane compositions, said adhesion promoting composition comprising:

(I) a first liquid organosilicon compound of a formula selected. from the group consisting of $(R^1O)_a Si(OR^2)_{4-a}$ and $R^3[OSi(OR^2)_3]_2$, and (II) a second liquid organosilicon compound selected from the group consisting of (1) organosilanes wherein the silicon atom is bonded to (a) at least one alkoxy, enoloxy or silanol group and (b) at least one silicon-bonded hydrogen atom or ethylenically unsaturated group bonded to silicon through carbon that will participate in a hydrosilation reaction; and (2) organosiloxanes comprising (a) units of the formula $R^{11}{}_dR^{12}{}_eSiO_{(4-d-e)/2}$, and (b) units containing at least one silicon-bonded alkoxy, enoloxy or silanol group,
wherein said alkoxy groups contain from 1 to 4 carbon atoms;
said enoloxy groups contain from 3 to 8 carbon atoms;
$R^1$ represents a radical selected from the group consisting of
$CH_2=C(R^4)R^5OR^6—$;
$[CH_2=C(R^4)R^5O]_bR^9—$;
$[CH_2=C(R^4)]_bR^9—$;
$[CH_2=C(R^4)R^8C(O)OR^6—$;
$CH_2=C(R^4)R^8OC(O)OR^6—$ and
$CH_2=C(R^4)R^5OC(O)R^7—$;
each $R^2$ is individually selected from the group consisting of alkyl radicals containing from 1 to 4 carbon atoms,
1-alkenyl and 1-cycloalkenyl radicals;
$R^3$ represents a divalent radical selected from the group consisting of
$CH_2=C(R^4)R^{10}=$;
$CH_2=C(R^4)R^5OR^{10}=$;
$CH_2=C(R^4)R^8C(O)OR^{10}=$;
$CH_2=C(R^4)RSOC(O)OR^{10}=$ and
$CH_2=C(R^4)R^5OC(O)R^{10}=$;
wherein $R^4$ is selected from the hydrogen atom or an alkyl radical;
$R^5$ is selected from a hydrocarbylene or substituted hydrocarbylene radical;
$R^6$ is selected from the same group as $R^5$, with the proviso that $R^6$ contains at least two carbon atoms;
$R^7$ is selected from the same group as $R^5$;
$R^8$ is selected from the group consisting of single bonds and $R^5$;
$R^9$ is selected from the group consisting of unsubstituted and substituted hydrocarbon radical with a valence of $b+1$;
$R^{10}$ is a trivalent hydrocarbon radical;
$R^{11}$ is selected from the group consisting of hydrogen and unsaturated groups bonded to silicon through carbon and capable of undergoing hydrosilation;
$R^{12}$ is selected from the group consisting of monovalent unsubstituted and substituted hydrocarbon radicals;
a is 1, 2 or 3;
b is 2 or 3
d is 1, 2 or 3; and
e is 0, 1 or 2;
with the proviso that the sum of d and e does not exceed 3.

10. A composition according to claim 9 wherein $R^1$ is $CH_2=C(R^4)CH_2R^8—$ or $CH_2=C(R^4)R^8C(O)OR^6—$;
$R^2$ contains from 1 to 20 carbon atoms;
$R^4$ is selected from hydrogen or methyl;
$R^5$ is alkylene containing from 1 to 12 carbon atoms;
$R^6$ is alkylene containing from 2 to 20 carbon atoms;
$R^8$ is alkylene containing from 6 to 12 carbon atoms;
said organosilanes are represented by the formula $R^{11}{}_dR^{12}{}_eSi(OX)_{4-d-3}$ wherein
$R^{11}$ is selected from the group consisting of hydrogen, alkenyl, and 3-methacryloxypropyl;
$R^{12}$ is alkyl containing from 1 to 4 carbon atoms;
OX is selected from the group consisting of alkoxy, enoloxy and hydroxyl groups;
said composition contains an organotitanium compound; and
said organosiloxanes (II) (2) further comprise units of the formula $R^{15}{}_fSiO_{(4-f/2)}$, where each $R^{15}$ is individually selected from the group consisting of monovalent unsubstituted and substituted hydrocarbon radicals and f is 0, 1, 2 or 3, with the proviso that units wherein f is 0 do not constitute more than 50 percent of the units of said organosiloxane.

11. A composition according to claim 10 wherein
$R^1$ is $CH_2=CHCH_2R^5$;
$R^2$ is selected from methyl, ethyl or isopropenyl,
$R^5$ contains from 1 to 8 carbon atoms;
$R^6$ is selected from ethylene or propylene;
$R^{11}$ is selected from alkenyl or 3-methacryloxypropyl; and
each $R^{15}$ is individually selected from the group consisting of alkyl containing from 1 to 4 carbon atoms, phenyl and 3,3,3-trifluoropropyl, with the proviso that at least one of the $R^{15}$ radicals on each silicon atom is methyl;
—OX is selected from hydroxyl, alkoxy containing from 1 to 4 carbon atoms or isopropenyloxy;
said organosiloxanes (II) (2) further-comprise an epoxyalkyl or an epoxycycloalkyl group bonded to silicon and from 1 to 10 siloxane units containing silicon-bonded hydrogen atoms; and
said organotitanium compound is selected from the group consisting of tetraalkyl titanares and alkenyltrialkyl titanares.

12. A composition according to claim 10 wherein $R^1$ is 10-undecenyl, $R^{11}$ is hydrogen, said organosiloxanes (II) (2) further comprise siloxane units containing silicon-bonded 3-glycidoxypropyl groups, and said units containing silicon-bonded alkoxy groups are $—[(CH_3O)_3SiC_6H_{12}](CH_3)SiO—$.

13. A composition according to claim 12 wherein said first liquid organosilicon compound is $C_{11}H_{21}OSi(OC_2H_5)_3$ and said second liquid organosilicon compound is the reaction product of an organohydrogensiloxane with less than a stoichiometric amount, based on the number of silicon-bonded hydrogen atoms in said organohydrogensiloxane, of a mixture of allylglycidyl ether and hexenyltrimethoxysilane.

* * * * *